United States Patent
Master et al.

(10) Patent No.: US 7,601,612 B1
(45) Date of Patent: Oct. 13, 2009

(54) METHOD FOR FORMING SOLDER JOINTS FOR A FLIP CHIP ASSEMBLY

(75) Inventors: Raj N. Master, San Jose, CA (US); Junaida A. Bakar, Penang (MY); Diong H. Ding, Penang (MY); Srinivasan Parthasarathy, Santa Clara, CA (US)

(73) Assignee: GlobalFoundries Inc., Grand Cayman (KY)

(*) Notice: Subject to any disclaimer, the term of this patent is extended or adjusted under 35 U.S.C. 154(b) by 409 days.

(21) Appl. No.: 11/255,971

(22) Filed: Oct. 24, 2005

(51) Int. Cl.
*H01L 21/00* (2006.01)

(52) U.S. Cl. .............. 438/455; 438/106; 438/107; 438/108; 257/772; 257/E23.023; 257/E23.026; 257/E21.508

(58) Field of Classification Search ......... 438/106–108, 438/455; 257/772, E23.023, E23.026, E21.508
See application file for complete search history.

(56) References Cited

U.S. PATENT DOCUMENTS

| | | | | |
|---|---|---|---|---|
| 5,202,153 A | * | 4/1993 | Siuta | 427/125 |
| 6,229,207 B1 | * | 5/2001 | Master | 257/697 |
| 6,617,195 B1 | * | 9/2003 | Master et al. | 438/107 |
| 2003/0186072 A1 | * | 10/2003 | Soga et al. | 428/620 |

OTHER PUBLICATIONS

Wu et al., "A study of flip-chip UBM/bump reliability with effects of SnPb solder composition," Mar. 2005, Microelectronics Reliability 46, pp. 41-52.*
Rinne, "Issues in accelerated electromigration of solder bumps," Sep. 2003, Microelectronics Reliability 43, pp. 1975-1980.*

* cited by examiner

*Primary Examiner*—Alexander G Ghyka
*Assistant Examiner*—Leonard Chang
(74) *Attorney, Agent, or Firm*—Ditthavong, Mori & Steiner, P.C.

(57) ABSTRACT

A method for forming a solder joint for a package arrangement with a dispersed Sn microstructure provides a flip chip on a package, with a flip chip having solder bumps to be connected by eutectic solder joints to pads on the package. The eutectic solder is reflowed at a solder bump/pad interface with a eutectic reflow profile that is configured to achieve eutectic solder joints having substantially evenly distributed Sn grains. The eutectic reflow profile includes an increased cooling rate and decreased hold time with a higher peak temperature. A defined ratio of the pad openings in the solder mask to the under bump metallurgy is provided. The eutectic reflow profile and the defined ratio prolong fatigue life in the package arrangement.

17 Claims, 2 Drawing Sheets

Amended
Fig. 2
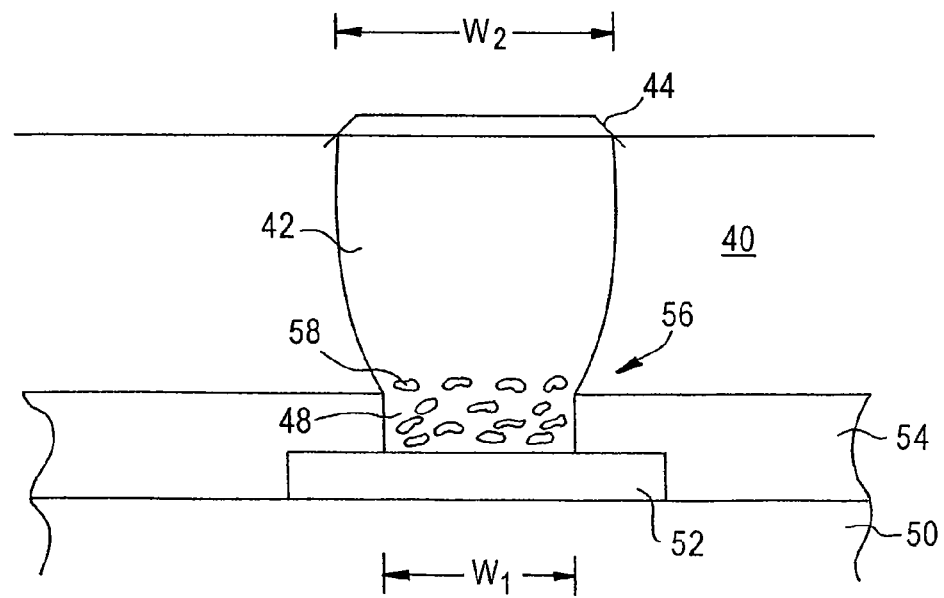

METHOD FOR FORMING SOLDER JOINTS FOR A FLIP CHIP ASSEMBLY

FIELD OF THE INVENTION

The present invention relates to microelectronic packaging of semiconductor chips and, more specifically, to methods for forming package arrangements, such as flip chip assemblies, with prolonged fatigue life for solder joint connections.

BACKGROUND OF THE INVENTION

The escalating requirements for high density and performance associated with ultra large scale integration technology creates significant challenges for the design and implementation of electrical connections between circuit components and external electrical circuitry.

Integrated circuit (IC) devices, whether individual active devices, individual passive devices, multiple active devices within a single chip, or multiple passive and active devices within a single chip, require suitable input/output (IO) connections between themselves and other circuit elements or structures. These devices are typically very small and fragile. Because of their size and fragility, they are commonly carried on substrates for support, i.e., carrier members.

One technique that supports the supports the increased device densities is the shift from peripheral wire bonding to area array chip interconnects. Area array chip interconnects involves bumps or solder joints that directly couple the IC chip or die to the carrier member. This technique accommodates an increased number of I/O terminals and provides electrical signals immediately below the chip, improving voltage noise margins and signal speed. One type of area array interconnect packaging technique is the flip chip (FC) solder interconnect on a carrier member.

In a flip chip assembly or package, the IC die and other devices are "bumped" with solder bumps or balls, i.e. a plurality of discrete solder bumps are formed over metal contacts on the surface of the die. The chip is then turned upside down or "flipped" so that the device side or face of the IC die couples to the carrier member such as found in a ceramic or plastic carrier member having balls, pins or land grid arrays. The solder bumps of the device are then attached to the carrier member through a eutectic solder reflow process to form an electrical and mechanical connection.

The carrier member conventionally employs a multi-layer substrate constructed of a plurality of laminated dielectric and conductive layers where individual IC chips are mounted to the top layer of the substrate. A pre-defined metallization pattern lies on each dielectric layer within the substrate. Metallization patterns on certain layers act as voltage reference planes and also provide power to the individual chips. Metallization patterns on other layers route signals between individual chips. Electrical connections to individual terminals of each chip and/or between separate layers are made through well-known vertical interconnects called "vias". Interconnect pins are bonded to metallic pads situated on the face of the substrate and are thereby connected through appropriate metallization patterns existing within the substrate. These interconnect patterns route electrical signals between a multi-chip integrated circuit package and external devices.

Advances in microelectronics technology tend to develop chips that occupy less physical space while performing more electronic functions. Conventionally, each chip is packaged for use in housings that protect the chip from its environment and provide I/O communication between the chip and external circuitry through sockets or solder connections to a circuit board or the like. Miniaturization results in generating more heat in less physical space, with less structure for transferring heat from the package. The heat of concern is derived from wiring resistance and active components switching. The temperature of the chip and substrate rises each time the device is turned on and falls each time the device is turned off.

As the chip and the substrate ordinarily are formed from different materials having different coefficiencies of thermal expansion (CTE), the chip and the substrate tend to expand and contract by different amounts, a phenomenon known as CTE mismatch. This causes the electrical contacts on the chip to move relative to electrical contact pads on the substrate as the temperature of the chip and substrate changes. This relative movement deforms the electrical interconnections between the chip and printed wiring board (PWB) and places them under mechanical stress. The stresses are applied repeatedly with repeated operation of the device, and can cause fatigue of the electrical interconnections. This is especially true for the solder balls of controlled collapse chip connections, also known as "C4", connections. It is therefore important to mitigate the substantial stress caused by thermal cycling as temperatures through the device change during operation.

Controlled collapse chip connection and flip chip technology has been successfully used for interconnecting high I/O count and area array solder bumps on the silicon chips to the base ceramic chip carriers (e.g., alumina carriers). In the C4 process, the solder wettable terminals on the chip are surrounded by ball limiting metallurgy and the matching footprint of solder wettable terminals on the corridors surrounded by a solder mass. These structures act to limit the flow of molten solder during reflow.

A eutectic reflow profile that has been employed to form the eutectic solder joints employs a 215° C. peak temperature, a cooling rate of 30° C./minutes and 2.7 minutes of hold time above the eutectic solder melting point of 183° C. It has been determined by the inventors that the solder microstructure in such joints is not equally distributed and dispersed throughout the eutectic solder joint. The relatively unequal distribution and dispersion of the solder microstructure resulting from the flip chip reflow process creates Sn boundaries which allow crack propagation along these grain boundaries to occur with repeated thermal cyclings.

For example, FIG. 1 depicts a cross-section of a solder joint 10 formed with a eutectic reflow profile as described above. A cross-section of the eutectic solder joint 10 reveals a solder bump 12 connected to under ball metallurgy 14 of a die 16.

The solder bump 12 has a high lead content, and is 95-97% lead (Pb) and approximately 3-5% tin (Sn). The eutectic solder 18 typically has a 63 Sn-37 Pb composition, with a melting temperature of 183° C., compared to the 320° C. melting temperature of the 95-97% Pb solder. After reflow, the eutectic solder 18 couples the solder bump and therefore the die 16, to the pad 20 of a package 22. A solder mask 24 defines a pad opening 26 above the pad. It is through this pad opening 26 that the eutectic solder 18 connects the pad 20 to the solder bump 12.

As can be appreciated from FIG. 1, the Sn 28 is not evenly dispersed and equally distributed within the eutectic solder joint 18 after the flip chip reflow. This creates grain boundaries 30 that allow solder cracking and causes open failures after repeated thermal cyclings.

SUMMARY OF THE INVENTION

There is a need for a method for forming solder joints of a package arrangement that prolongs the fatigue life of flip chip units.

This and other needs are met by embodiments of the present invention which provide a method of forming a solder joint for a package arrangement with a dispersed Sn microstructure. This method comprises the steps of providing a flip chip on a package, the flip chip having solder bumps to be connected by eutectic solder joints through pads on the package. Eutectic solder is reflowed at a solder bump/pad interface with a eutectic reflow profile configured to achieve eutectic solder joints having substantially evenly distributed Sn grains.

By reflowing the eutectic solder with a eutectic reflow profile that is configured to achieve eutectic solder joints having substantially evenly distributed Sn grains, propagation of crack lines along Sn boundaries is minimized. This prolongs the fatigue life of the flip chip units. According to certain aspects, the hold time at high peak temperature is decreased in comparison to prior eutectic reflow profiles, thereby providing better distribution of α-Sn phase material. Further, according to certain aspects, the cooling rate is increased, which causes the grain size of the α-Sn to be smaller. This further minimizes potential solder cracking along Sn grain boundaries after thermal cycling.

In other aspects of the present invention, a method of forming a solder joint for a package arrangement is provided, comprising the steps of forming a package with pads on the surface thereof, with pad openings exposing a portion of the pads. Solder bumps are formed on under bump metallurgy of a chip. The ratio of a width of the pad openings to a width of the under bump metallurgy is approximately 1.0 to about 1.2 to about 1.6. In certain aspects, the ratio is about 1.0 to 1.4.

The ratio of the width of the pad openings from the solder mask to the under bump metallurgy further enhances the reliability of the flip chip eutectic solder joints and prolongs the fatigue life.

In still further aspects of the invention, a method is provided for forming solder joints for a package arrangement and comprises the steps of forming a package and chip arrangement with a pad opening to under bump metallurgy ratio of between about 1.0:1.2 to about 1.0:1.6. Eutectic solder is reflowed at a solder bump/pad interface with a eutectic reflow profile configured to achieve eutectic solder joints having substantially evenly distributed Sn grains.

The combination of providing a defined ratio of pad opening on the solder mask to the under bump metallurgy of between 1.0:1.2 to about 1.0:1.6, together with a eutectic reflow profile configured to achieve eutectic solder joints having substantially distributed Sn grains, prolongs the fatigue life and therefore reliability of the package assembly through thermal cycles.

The foregoing and other features, aspects and advantages of the present invention will become more apparent from the following detailed description of the present invention when taken in conjunction with the accompanying drawings.

BRIEF DESCRIPTION OF THE DRAWINGS

FIG. 2 is a cross-section of a solder joint formed in accordance with embodiments of the present invention.

DETAILED DESCRIPTION OF THE INVENTION

The present invention addresses and solves problems related to the reliability of eutectic solder joints of flip chips, and seeks to improve the fatigue life of such solder joints. This is achieved, in part, by providing for a eutectic reflow profile that produces more evenly distributed Sn grains, thereby reducing grain boundaries and preventing crack propagation along grain boundaries. In certain embodiments, the eutectic reflow profile includes decreased hold time, higher peak temperature and an increased cooling rate, as compared to prior eutectic reflow profiles. Further, providing a ratio of a width of the pad openings on the solder mask to the width of the under bump metallurgy of approximately 1.0:1.2 to about 1.0:1.6 (and approximately 1.0:1.4 in especially preferred embodiments) also enhances the fatigue life of the arrangement.

As described, the methodologies for producing eutectic solder joints, and the eutectic reflow profile employed in these methodologies, produce eutectic solder joints to optimize the distribution of Sn grains within the eutectic solder joints. An exemplary eutectic reflow profile according to the prior art includes a peak temperature of 215° C., a cooling rate of 30° C./minutes and 2.7 minutes hold time above the melting point of 183° C. Unfortunately, this eutectic reflow profile results in a relatively uneven distribution of the Sn grains within the eutectic solder joint.

The present invention provides for eutectic reflow profiles characterized by at least one of greater peak temperatures, faster cooling rates and reduced hold times, in certain embodiments. These changes to the eutectic reflow profile provide for greater distribution of the α-Sn phase and even distribution of the Sn grains within the eutectic solder joint. Because of this greater distribution, the solder cracking along Sn grain boundaries after thermal cycling is minimized.

Figure 1:
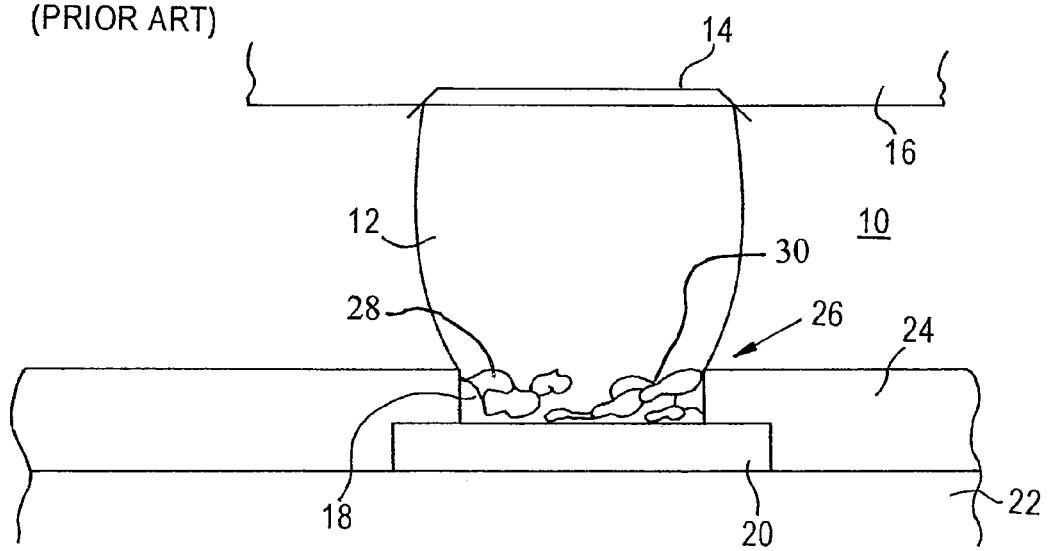
FIG. 1 is a cross-section of a solder joint formed in accordance with prior art methodologies.
Figure 3:
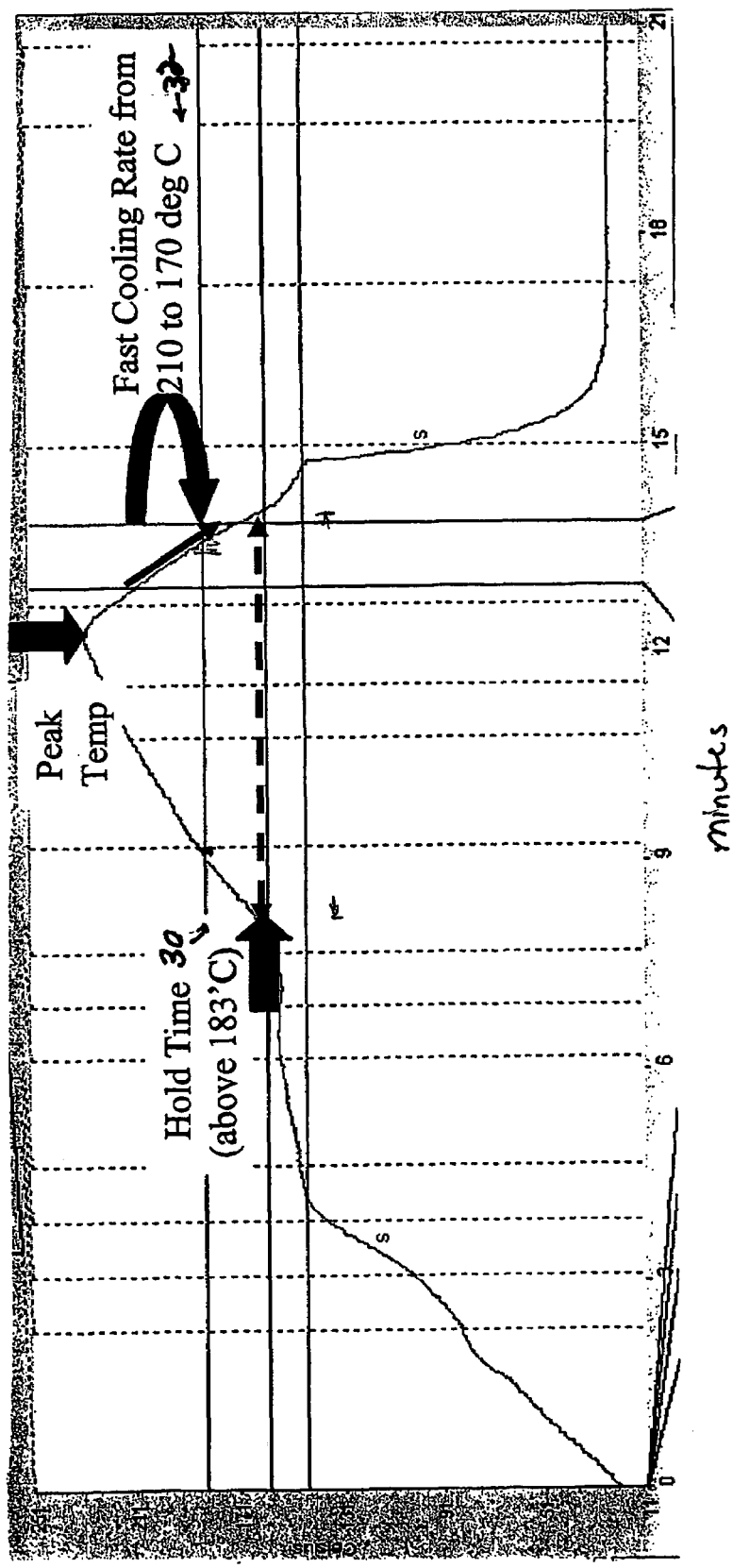
FIG. 3 is a eutectic reflow profile in accordance with exemplary embodiments of the present invention.

FIG. 3 depicts an exemplary eutectic reflow profile in accordance with certain embodiments of the invention. This depiction is exemplary only, as changes may be made without departing from the scope of the present invention. The y-axis of the eutectic reflow profile depicts the temperature in ° C., while the x-axis depicts time in units of minutes.

The parameters that affect the distribution of the Sn grains within the eutectic solder joint have been determined by the inventors to include the hold time, peak temperature and cooling rate. The hold time is defined as the amount of time that the eutectic solder joint is exposed to temperatures above the melting point of the eutectic solder, such as 183° C. This is designated with arrows 30 in FIG. 3. In embodiments of the present invention, the hold time of the eutectic reflow profile is less than 2.5 minutes. In certain further embodiments, the hold time is 100 seconds or less, and in certain other embodiments, the hold time is between 80-100 seconds.

Another parameter in the eutectic reflow profile is the peak temperature. In FIG. 2, the peak temperature is 227° C. However, in embodiments of the present invention, the peak temperature is greater than about 225° C. to about 240° C. Along with the decreased hold time, this higher peak temperature achieves a better distribution of the α-Sn phase.

Another parameter that appears to play a role in achieving even Sn distribution in the eutectic solder joint is the cooling rate from 210° C. to 170° C. As seen in FIG. 3, this cooling, designated by arrow 32, provides a fast cooling rate from 210°

C. to 170° C. within about 1 minute. The increased cooling rate produces a smaller grain size of α-Sn.

According to certain aspects of the invention, the ratio of the pad opening size in the solder mask to the under bump metallurgy (UBM) on the die side is precisely controlled to further enhance the fatigue life through a solder mask to UBM ratio of approximately 1.0:1.4 as has been determined by the inventors to prolong fatigue life of the eutectic solder joints. In certain embodiments of the invention, the ratio may be from 1.0:1.2 to 1.0:1.6.

FIG. 2 depicts a cross-section of a eutectic solder joint 40 formed in accordance with the methodologies of the present invention, including a eutectic reflow profile such as that depicted in FIG. 3 and employing a ratio of approximately 1.0:1.4 The arrangement 40 includes a solder bump 42 formed on under ball metallurgy 44 of a die 36. A package 50 includes a pad 52 over which a solder mask 54 is formed. Solder mask 54 includes pad openings 56 that expose a portion of the top surface of the pads 52. A eutectic solder joint 48 is formed between the pad 52 and the solder bump 42 through the eutectic reflow process.

In accordance with aspects of the present invention, the width $W_1$ of the pad opening 56 in the solder mask 54 to the width $W_2$ of the under bump metallurgy 44 is between about 1.0:1.2 to about 1.0:1.6, and in especially preferred aspects is about 1.0:1.4.

Forming the eutectic solder joint according to the eutectic reflow profile of the present invention achieves more even distribution of the Sn grains 58, as depicted in FIG. 2. Due to the more even distribution, as well as the controlled ratio of the solder mask pad openings to under bump metallurgy, a prolonged fatigue life for the arrangement 40 is achieved. This creates enhanced reliability of the product for a longer period of time.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of forming a solder joint for a package arrangement, with a dispersed Sn microstructure and minimized grain boundaries, comprising the steps of:
    providing a flip-chip on a package, the flip-chip having solder bumps to be connected by electric solder joints to pads on the package;
    reflowing eutectic solder at a solder bump/pad interface with a eutectic reflow profile configured to achieve eutectic solder joints having substantially evenly distributed Sn grains and minimized grain boundaries.

2. The method of claim 1, wherein the eutectic reflow profile includes a hold time of less than 2.5 minutes above a melting point of the eutectic solder.

3. The method of claim 2, wherein the hold time is 100 seconds or less.

4. The method of claim 3, wherein the hold time is between 80 to 100 seconds.

5. The method of claim 1, wherein the eutectic reflow profile has a cooling rate from approximately 210° C. of greater than about 35° C./minute.

6. The method of claim 5, wherein the cooling rate is about 40° C./minute.

7. The method of claim 1, wherein the eutectic reflow profile has a peak temperature of greater than about 225° C.

8. The method of claim 7, wherein the eutectic reflow profile has a peak temperature of between about 225° C. to about 240° C.

9. The method of claim 1, where in the eutectic reflow profile includes: a hold time of less than 2.5 minutes above the melting point of the eutectic solder; a cooling rate from approximately 210° C. of greater than about 35° C./minute; and a peak temperature of greater than about 225° C.

10. The method of claim 1, wherein the eutectic reflow profile includes: a hold time between about 80 to about 100 seconds above a melting point of the solder; a cooling rate from approximately 210° C. of about 40° C./minute; and a peak temperature of between about 225° C. to about 240° C.

11. A method of forming solder joints having minimized grain boundaries for a package arrangement, comprising the steps of:
    forming a package and chip arrangement with a pad opening to under bump metallurgy ratio of between about 1.0:1.2 to about 1.0:1.6; and
    reflowing eutectic solder at a solder bump/pad interface with a eutectic reflow profile configured to achieve eutectic solder joints having substantially evenly distributed Sn grains and minimized grain boundaries.

12. The method of claim 11, wherein the ratio is about 1.0:1.4.

13. The method of claim 12, wherein the eutectic reflow profile includes: a hold time of less than 2.5 minutes above a melting point of the eutectic solder;
    a cooling rate from approximately 210° C. to 170° C.

14. The method of claim 12, wherein the eutectic reflow profile includes: a hold time between about 80 to about 100 seconds above a melting point of the solder; a cooling rate from approximately 210° C. of about 40° C./minute; and a peak temperature of between about 225° C. to about 240° C.

15. The method of claim 12, wherein the eutectic reflow profile includes a hold time of between about 80 to about 100 seconds.

16. The method of claim 12, wherein the eutectic reflow profile has a cooling rate from approximately 210° C. of about 40° C./minute.

17. The method of claim 12, wherein the eutectic reflow profile has a peak temperature of between about 225° C. to about 240° C.

* * * * *